(12) United States Patent
Lin et al.

(10) Patent No.: US 12,713,968 B2
(45) Date of Patent: Aug. 18, 2026

(54) FAN-OUT WAFER-LEVEL PACKAGING STRUCTURE AND METHOD FOR MANUFACTURING SAME

(71) Applicant: SJ Semiconductor(Jiangyin) Corporation, Jiangyin City (CN)

(72) Inventors: Chengchung Lin, Jiangyin City (CN); Jin Yang, Jiangyin City (CN)

(73) Assignee: SJ Semiconductor(Jiangyin) Corporation, Jiangyin City (CN)

( * ) Notice: Subject to any disclaimer, the term of this patent is extended or adjusted under 35 U.S.C. 154(b) by 545 days.

(21) Appl. No.: 18/142,412

(22) Filed: May 2, 2023

(65) Prior Publication Data

US 2023/0386952 A1 Nov. 30, 2023

(30) Foreign Application Priority Data

May 27, 2022 (CN) ......................... 202210591729.5

(51) Int. Cl.
*H10W 74/10* (2026.01)
*H10W 74/01* (2026.01)
*H10W 90/00* (2026.01)

(52) U.S. Cl.
CPC ....... *H10W 74/121* (2026.01); *H10W 74/019* (2026.01); *H10W 74/117* (2026.01); *H10W 90/00* (2026.01)

(58) Field of Classification Search
None
See application file for complete search history.

(56) References Cited

U.S. PATENT DOCUMENTS

2010/0320576 A1* 12/2010 Hu .......................... H01L 24/31 438/758
2018/0286824 A1* 10/2018 Jeng .................... H01L 21/6835
2019/0006554 A1* 1/2019 Kususe ................ H10H 20/825
2022/0068736 A1* 3/2022 Lo ........................... H01L 24/81

* cited by examiner

*Primary Examiner* — Jay C Chang
(74) *Attorney, Agent, or Firm* — IPRTOP LLC

(57) ABSTRACT

A fan-out wafer-level packaging structure and a method for manufacturing it are disclosed. The structure includes: a rewiring layer, a chip, an electrical component, a protective layer made of UV-curable adhesive, a molding layer, and a solder ball. The protective layer is disposed on surfaces of the electrical component, sealing the electrical component, and ensuring its safe operation and reliability, mitigating risks of melting and spillage of solder in the electrical component, and preventing electrical shorts and delamination between molding layers and the electrical component. The protective layer is formed by UV-curing or UV/thermal-dual-curing, to prevent loss of upper portions of the adhesive resulted from the upper portions flowing downward after dispensing. A dual-curing process can further solidify the protective layer, enabling the protective layer to better seal and protect the electrical component.

6 Claims, 2 Drawing Sheets

FAN-OUT WAFER-LEVEL PACKAGING STRUCTURE AND METHOD FOR MANUFACTURING SAME

CROSS REFERENCE TO RELATED APPLICATION

The present application claims the benefit of priority to Chinese Patent Application No. CN 202210591729.5, entitled "FAN-OUT WAFER-LEVEL PACKAGING STRUCTURE AND METHOD FOR MANUFACTURING SAME", filed with CNIPA on May 27, 2022, the disclosure of which is incorporated herein by reference in its entirety for all purposes.

FIELD OF TECHNOLOGY

The present disclosure relates to semiconductor packaging technology, in particular, to a fan-out wafer-level packaging structure and a method for manufacturing the same.

BACKGROUND

Electronic packaging has become an important aspect of the semiconductor industry. After decades of evolution, high-density, small-size packaging has become the mainstream of electronic packaging. Fan-out wafer-level packaging is an embedded chip packaging method, and it is currently one of the most advanced packaging methods with more input/output ports and better integration flexibility. Also, more and more chips and passive components are required to be packaged together inside a single package unit, as commercial electronic products get increasingly intricate. Generally, in the preparation of a fan-out wafer-level packaging structure, chips and passive components are first placed on a substrate, followed by encapsulation with an epoxy molding compound (EMC).

In the above process, several high-temperature processes are usually needed, such as pre-pressing including baking at 240° C. for 196 hours, follow the Ruhstahl Hausen process, and perform 3 times (3×) reflow (peak temperature up to 260° C.), etc. However, these high-temperature processes may melt the Tin-Silver (SnAg) solder of the passive components (such as capacitors), since the melting temperature of SnAg is only 221° C., resulting in solder melting and flow, especially when the packaging structure is flipped during the pre-pressing process. This may further lead to electrical shorts or delamination between EMC and capacitors.

Therefore, providing a new fan-out wafer-level packaging structure and a method for manufacturing it has become an important task to be tackled by those skilled in the art.

SUMMARY

The present disclosure provides a method for manufacturing a fan-out wafer-level packaging structure, comprising: 1) forming a rewiring layer over a support substrate; 2) soldering a bonding surface of an electrical component to a first surface of the rewiring layer, dispensing UV-curable adhesive on surfaces of the electrical component, and irradiate the UV-curable adhesive with UV light so that the UV-curable adhesive solidifies and forms a protective layer made of UV-curable adhesive; 3) soldering a chip to the first surface of the rewiring layer, and forming a molding layer encapsulating the chip, the electrical component, and the protective layer, wherein heat generated during formation of the molding layer further heats and solidifies the protective layer; 4) removing the support substrate, and disposing a solder ball on a second surface of the rewiring layer.

The present disclosure also provides a fan-out wafer-level packaging structure, comprising: a rewiring layer, a chip, an electrical component, a protective layer made of UV-curable adhesive, a molding layer, and a solder ball; wherein the chip and a bonding surface of the electrical component are soldered to a first surface of the rewiring layer, wherein the protective layer is disposed on surfaces of the electrical component, wherein the molding layer encapsulates the chip and the electrical component, wherein the solder ball is disposed on a second surface of the rewiring layer.

The fan-out wafer-level packaging structure of the present disclosure and the method for manufacturing the same have the following beneficial effects:

1) The protective layer made of UV-curable adhesive is disposed on a top surface and side surfaces of the electrical component, sealing the electrical component, and ensuring its safe operation and reliability, mitigating risks of melting and spillage of solder in the electrical component, and preventing electrical shorts and delamination between the molding layer and the electrical component, which also improves the reliability of the fan-out wafer-level packaging structure.

2). The protective layer made of UV-curable adhesive is formed by UV-curing or UV/thermal-dual-curing, so as to prevent loss of upper portions of the adhesive resulted from the upper portions flowing downward after dispensing. Note that a dual-curing process can further solidify the protective layer, enabling the protective layer to better seal and protect the electrical component.

3). The protective layer has multiple functions; it not only protects passive components, but also protects active components.

BRIEF DESCRIPTION OF THE DRAWINGS

FIG. 5 shows a schematic diagram of the fan-out wafer-level packaging structure according to the present disclosure.

REFERENCE NUMERALS

Figure 1:
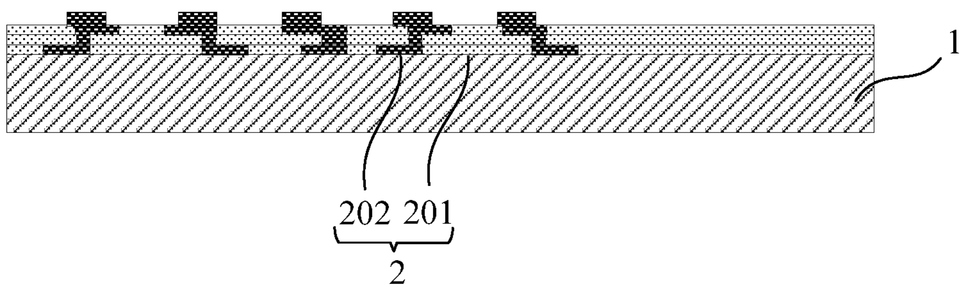
FIGS. 1 to 5 show schematic cross-sectional views of the intermediate structures of a fan-out wafer-level packaging structure during operations of a method for manufacturing the fan-out wafer-level packaging structure. Specifically.

1 Support substrate
2 Rewiring layer
201 Dielectric layer
202 Wiring metal layer
3 Electrical component
4 Protective layer
5 Chip
6 Molding layer
7 Solder ball
8 UV light

DETAILED DESCRIPTION

The present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 1-5. It should be noted that the drawings provided in this disclosure only illustrate the basic concept of the present disclosure in a schematic way, so the drawings only show the components closely related to the present disclosure. The drawings are not necessarily drawn according to the number, shape, and size of the components in actual implementation; during the actual implementation, the type, quantity, and proportion of each component can be changed as needed, and the components' layout may also be more complicated.

As shown in FIGS. 1 to 5, the present disclosure provides a method for manufacturing a fan-out wafer-level packaging structure, and the method includes steps 1) to 4) as described below.

As shown in FIG. 1, step 1) includes providing a support substrate 1, and forming a rewiring layer 2 on the support substrate 1.

As an example, the rewiring layer 2 includes a stack of dielectric layers 201 and a stack of patterned wiring metal layers 202 disposed in the dielectric layers 201.

Figure 2:
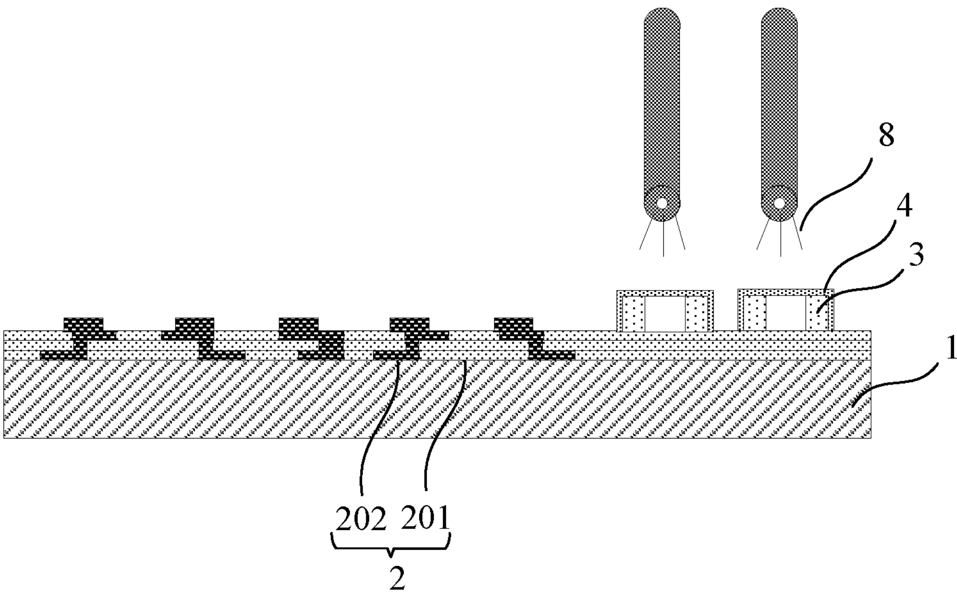

As shown in FIG. 2, step 2) includes soldering a bonding surface of an electrical component 3 to a first surface of the rewiring layer 2, dispensing UV-curable adhesive on surfaces of the electrical component 3, and irradiate the UV-curable adhesive with UV light 8 so that the UV-curable adhesive solidifies and forms a protective layer 4 made of UV-curable adhesive.

When the protective layer 4 made of UV-curable adhesive is solidified, it is disposed on the top surface and side surfaces of the electrical component 3, herein the top surface of the electrical component 3 is opposite to the bonding surface of the electrical component 3. The protective layer 4 and the rewiring layer 2 below the electrical component 3 together form a structure that envelops the electrical component 3, and prevents solder spillage from under the electrical component 3.

Specifically, the bonding surface of the electrical component 3 is electrically connected to the wiring metal layers 202.

As an example, the electrical component 3 includes one or more of an active component and a passive component.

As an example, the active component includes, but is not limited to, one or more of a power management chip, an emitter chip, and a receiver chip, and the passive component includes, but is not limited to, one or more of a capacitive component, an inductive component, and a resistive component.

After the UV-curable adhesive is dispensed to the surfaces of the electrical component 3, UV light 8 of a certain wavelength is used to irradiate the UV-curable adhesive, during which the UV-curable adhesive is quickly cured, so as to prevent loss of upper portions of the adhesive resulted from the upper portions reflowing downward after dispensing.

As an example, the glass transition temperature Tg of the UV-curable adhesive is greater than or equal to 200° C.

Figure 3:
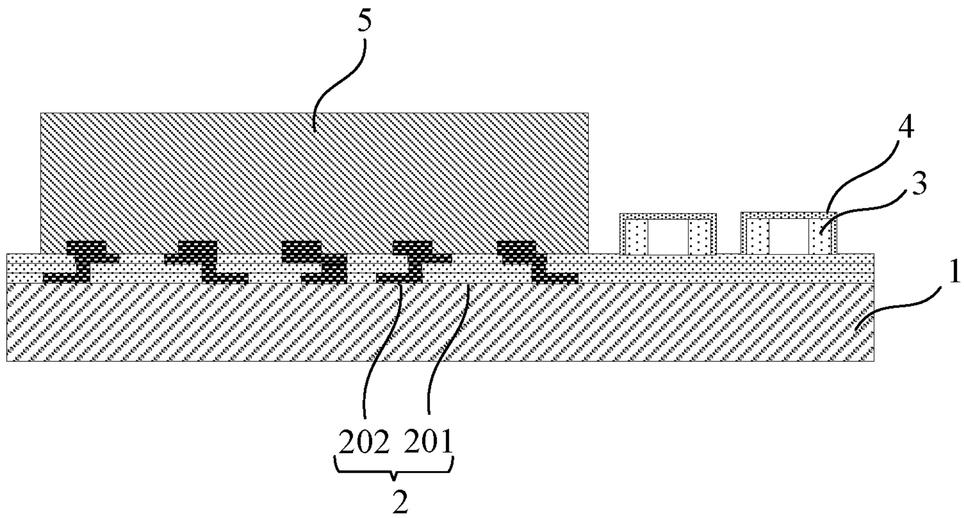
Figure 4:
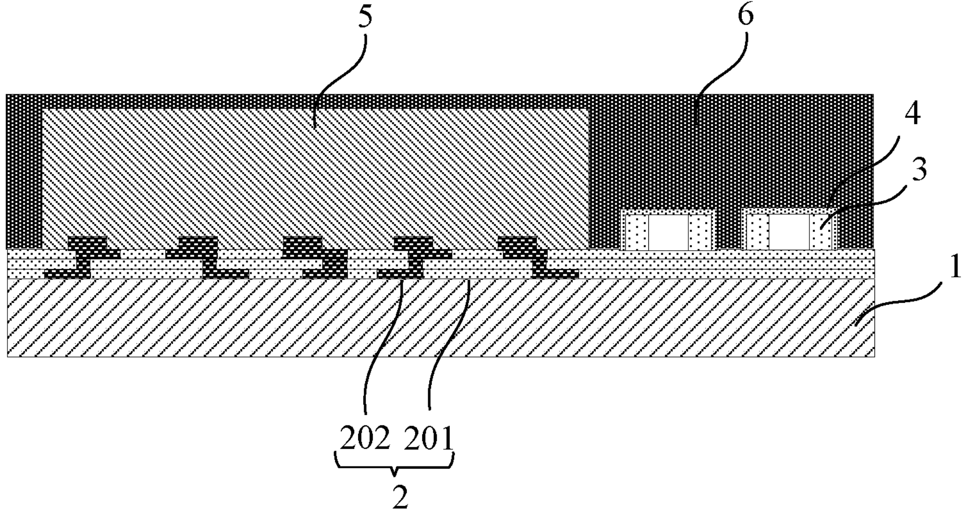

As shown in FIGS. 3 and 4, step 3) includes: soldering a chip 5 to the first surface of the rewiring layer 2, and forming a molding layer 6 encapsulating the chip 5, the electrical component 3, and the protective layer 4, wherein heat generated during formation of the molding layer 6 further heats and solidifies the protective layer 4.

Specifically, the chip 5 is electrically connected to the wiring metal layers 202 in the rewiring layer 2.

As an example, the material of the molding layer 6 includes one of epoxy resin, resin, and plasticizable polymer, and a method for manufacturing the molding layer 6 includes one of the techniques like compression molding, transfer molding, liquid seal molding, mold bottom filling, capillary bottom filling, vacuum lamination, and spin coating. The above techniques for manufacturing the molding layer 6 generally require high temperature baking, pre-pressing etc., so that the protective layer 4 can be heat-cured again.

The UV-curable adhesive after dual-curing (i.e., UV curing in step 2 and heat curing in step 3) is more adequately solidified, and the bonding strength between the protective layer 4, the electrical component 3, and the rewiring layer 2 is stronger, which provides better sealing protection to the electrical component 3 and prevents solder spillage.

Figure 5:
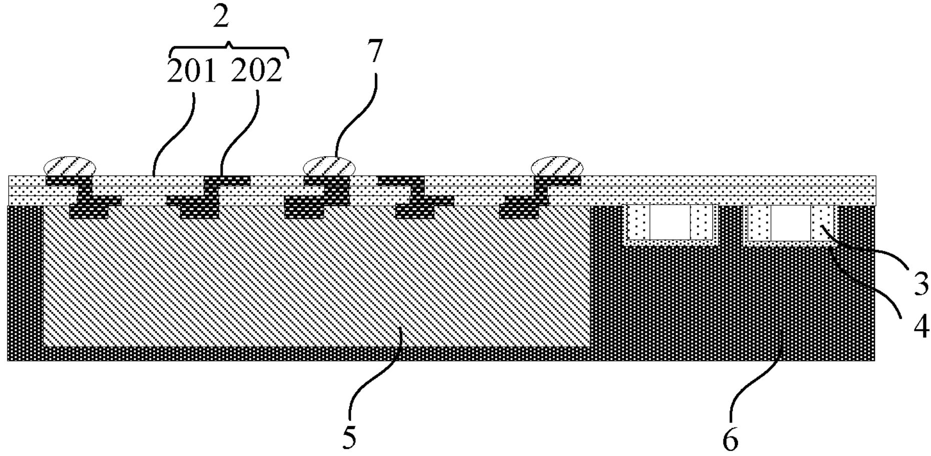

Finally, as shown in FIG. 5, step 4) includes: removing the support substrate 1, and disposing a solder ball 7 on a second surface of the rewiring layer 2.

Specifically, the intermediate structure obtained in step 3) can be flipped upside down before removing the support substrate 1. Since the electrical component 3 is sealed by the protective layer 4, even if the intermediate structure is flipped upside down, solder in the electrical component 3 will not overflow into the molding layer 6, which prevents electrical shorts and delamination between the molding layer 6 and the electrical component 3, and improves the reliability of the fan-out wafer-level packaging structure.

As shown in FIG. 5, the present disclosure also provides a fan-out wafer-level packaging structure, which may or may not be manufactured using the method described above. The packaging structure includes: a rewiring layer 2, a chip 5, an electrical component 3, a protective layer 4 made of UV-curable adhesive, a molding layer 6, and a solder ball 7; the chip 5 and a bonding surface of the electrical component 3 are soldered to a first surface of the rewiring layer 2, and the protective layer 4 is disposed on surfaces of the electrical component 3; the molding layer 6 encapsulates the chip 5 and the electrical component 3, and the solder ball 7 is disposed on a second surface of the rewiring layer 2.

As an example, the protective layer 4 is disposed on a top surface and side surfaces of the electrical component 3, and the top surface of the electrical component 3 is opposite to the bonding surface of the electrical component 3. The protective layer 4 and the rewiring layer 2 below the electrical component 3 together form a structure that envelops the electrical component 3, and prevent solder spillage from the electrical component 3. A surface of the electrical component 3 that is not covered by the protective layer 4 is the bonding surface of the electrical component 3, and provides a soldered electrical connection between the electrical component 3 and the rewiring layer 2.

As an example, the rewiring layer 2 includes dielectric layers 201 and a wiring metal layers 202 disposed in the dielectric layers 201. The bonding surface of the electrical component 3 is electrically connected to the wiring metal layer 2. The rewiring layer 2 provides electrical lead-out of the chip 5 and the electrical component 3 to a suitable location.

As an example, the electrical component 3 includes one or more of an active component, and a passive component.

As an example, the active component includes, but is not limited to, one or more of a power management chip, an emitter chip, and a receiver chip; and the passive component includes, but is not limited to, one or more of a capacitive component, an inductive component, and a resistive component.

In the fan-out wafer-level packaging structure of the present disclosure, the protective layer 4 disposed on the top surface and side surfaces of the electrical component 3, sealing the electrical component 3, and ensuring its safe operation and reliability, mitigating risks of melting and spillage of solder in the electrical component 3, and preventing electrical shorts and delamination between the molding layer 6 and the electrical component 3, which also improves the reliability of the fan-out wafer-level packaging structure.

In summary, the present disclosure provides a fan-out wafer-level packaging structure and a method for manufacturing the same are disclosed. The structure includes: a rewiring layer, a chip, an electrical component, a protective layer made of UV-curable adhesive, a molding layer, and a solder ball, wherein the protective layer is disposed on surfaces of the electrical component. The protective layer made of UV-curable adhesive is disposed on a top surface and side surfaces of the electrical component, sealing the electrical component, and ensuring its safe operation and reliability, mitigating risks of melting and spillage of solder in the electrical component, and preventing electrical shorts and delamination between molding layers and the electrical component. The protective layer of the present disclosure is formed by UV-curing or UV/thermal-dual-curing, so as to prevent loss of upper portions of the adhesive resulted from the upper portions flowing downward after dispensing. Note that a dual-curing process can further solidify the protective layer, enabling the protective layer to better seal and protect the electrical component.

Therefore, the present disclosure effectively overcomes various shortcomings in the existing technology and has high industrial application value.

The above-mentioned examples are for exemplarily describing the principle and effects of the present disclosure instead of limiting the present disclosure. Those skilled in the art can make modifications or changes to the above-mentioned examples without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for manufacturing a fan-out wafer-level packaging structure, comprising:

1) Forming a rewiring layer over a support substrate;
2) soldering a bonding surface of an electrical component to a first surface of the rewiring layer, dispensing ultraviolet light-curable (UV-curable) adhesive on surfaces of the electrical component, and irradiating the UV-curable adhesive with ultraviolet (UV) light, wherein the UV-curable adhesive solidifies in the UV light and forms a protective layer;
3) Soldering a chip to the first surface of the rewiring layer, next to the electrical component, and forming a molding layer encapsulating the chip, the electrical component, and the protective layer, wherein heat generated during formation of the molding layer further heats and solidifies the protective layer, wherein when the protective layer made of UV-curable adhesive is solidified, the protective layer is disposed on a top surface and side surfaces of the electrical component, and wherein the top surface of the electrical component is opposite to the bonding surface of the electrical component; and 4) Removing the support substrate, and disposing a solder ball on a second surface of the rewiring layer.

2. The method for manufacturing the fan-out wafer-level packaging structure according to claim 1, wherein the electrical component comprises one or more of an active component and a passive component.

3. The method for manufacturing the fan-out wafer-level packaging structure according to claim 2, wherein the active component comprises one or more of a power management chip, an emitter chip, and a receiver chip, and wherein the passive component comprises one or more of a capacitive component, an inductive component, and a resistive component.

4. The method for manufacturing the fan-out wafer-level packaging structure according to claim 1, wherein a glass transition temperature of the UV-curable adhesive is greater than or equal to 200° C.

5. The method for manufacturing the fan-out wafer-level packaging structure according to claim 1, wherein the rewiring layer comprises a dielectric layer and a wiring metal layer disposed in the dielectric layer, wherein the chip is electrically connected to the wiring metal layer, and wherein the bonding surface of the electrical component is electrically connected to the wiring metal layer.

6. The method for manufacturing the fan-out wafer-level packaging structure according to claim 1, wherein a material of the molding layer comprises one of epoxy resin, resin, and plasticizable polymer, and wherein a technique for manufacturing the molding layer comprises one of compression molding, transfer molding, liquid seal molding, mold bottom filling, capillary bottom filling, vacuum lamination, and spin coating.

* * * * *